(12) United States Patent
Makinwa et al.

(10) Patent No.: US 7,920,032 B2
(45) Date of Patent: Apr. 5, 2011

(54) OSCILLATOR BASED ON THERMAL DIFFUSION

(75) Inventors: Kofi Afolabi Anthony Makinwa, Delft (NL); Johan Frederik Witte, Delft (NL)

(73) Assignee: Stichting voor de Technische Wetenschappen (NL)

( * ) Notice: Subject to any disclaimer, the term of this patent is extended or adjusted under 35 U.S.C. 154(b) by 395 days.

(21) Appl. No.: 11/884,590

(22) PCT Filed: Jan. 30, 2006

(86) PCT No.: PCT/NL2006/050018
§ 371 (c)(1),
(2), (4) Date: Sep. 22, 2008

(87) PCT Pub. No.: WO2006/132531
PCT Pub. Date: Dec. 14, 2006

(65) Prior Publication Data
US 2009/0212875 A1    Aug. 27, 2009

(30) Foreign Application Priority Data
Feb. 18, 2005 (EP) .................................. 05075398

(51) Int. Cl.
*H03L 1/00* (2006.01)
(52) U.S. Cl. ............................. 331/176; 331/66; 331/175
(58) Field of Classification Search .................... 331/66, 331/176, 175
See application file for complete search history.

(56) References Cited

U.S. PATENT DOCUMENTS
| | | |
|---|---|---|
| 4,243,949 A | 1/1981 | Saul et al. |
| 4,646,035 A | 2/1987 | Chapelle |
| 5,041,800 A | 8/1991 | Long et al. |
| 6,121,848 A | 9/2000 | Sauer |

OTHER PUBLICATIONS
Szekely et al. "Test Structure for Thermal Monitoring", In. Proc. of the 1996 IEEE International Conference on Microelectronic Test Structures, vol. 9, Mar. 1996, pp. 111-115.
Szekely et al. "Thermal Test and Monitoring", In. Proc. of the 1995 IEEE European Design and Test Conference, 1995, p. 601.

*Primary Examiner* — Arnold Kinkead
(74) *Attorney, Agent, or Firm* — The Webb Law Firm

(57) ABSTRACT

An oscillator device for generating an oscillator signal, includes a heater arrangement, a first switching element, a temperature sensor, signal process means, and voltage controlled oscillator; an output of the temperature sensor being connected to an input of the signal processing means, and an output of the signal processing means being connected to an input of the voltage controlled oscillator. The first switching element is arranged for receiving the oscillator signal from the voltage controlled oscillator and for providing a heater drive signal to either a first heater element or a second heater element of the heater arrangement based on the oscillator signal. The signal processing means comprise a synchronous demodulator.

19 Claims, 5 Drawing Sheets

OSCILLATOR BASED ON THERMAL DIFFUSION

BACKGROUND OF THE INVENTION

1. Field of the Invention

The present invention relates, in general, to an oscillator device.

2. Description of Related Art

Many microelectronic circuits require the input of some kind of clock signal for the timing of their operation. Generally, such a clock signal is provided by an oscillator device implemented on the same substrate as the microelectronic circuit. The oscillator device is arranged to provide a periodic signal with a substantially constant frequency.

Such integrated circuit oscillators require some kind of frequency reference, which is used to keep the frequency of oscillation constant. Such a frequency reference is usually realized by using accurate external components such as resistors, capacitors and crystal or ceramic resonators.

However, frequency references realized with accurate external components increase the size and cost of an integrated circuit (IC) oscillator. Unfortunately, the components available in a standard IC process are quite inaccurate. Their use means that the frequency of the oscillator's output must be trimmed, which increases manufacturing cost. Alternatively, realizing more accurate components in an IC process results in significantly increased complexity and which also increases manufacturing costs.

From the prior art, thermal oscillators on semiconductor substrates are known in which the generated frequency is determined by the diffusion rate of heat in the substrate. U.S. Pat. No. 6,121,848 discloses a thermal oscillator circuit, which consists of a thermal RC network (i.e. heater and temperature sensor implemented in the same substrate and located some fixed distance apart), and signal processing means, which consists of a limiting amplifier (i.e. a comparator), a multiplier, a low pass filter and a voltage controlled oscillator. During use, the voltage controlled oscillator provides heat pulses to the thermal RC network. The limiting amplifier receives an input signal from the thermal RC network which input signal relates to the temporal temperature obtained at the output of the thermal RC network. The limiting amplifier amplifies the signal with high gain in such a way that the signal is transformed into a square-wave, which reflects the polarity of the input signal.

The oscillator circuit as disclosed in U.S. Pat. No. 6,121, 848, when integrated on a semiconductor substrate, displays some undesirable features for the following reasons:

The high thermal conductivity of the substrate requires a relatively large input power to ensure a measurable signal at the output of the thermal RC network (in comparison with the thermal noise of the temperature sensor and the amplifier).

Furthermore, for smaller signal levels the oscillator circuit from the prior art will suffer from inaccuracies inherent to the function of the limiting amplifier. The polarity of an input signal near the threshold level of the limiting amplifier may be randomly altered by thermal noise, causing random fluctuations in the polarity of the amplifier's square-wave output. In this way, small noise fluctuations give rise to much larger changes at the output of the limiting amplifier. The position of an edge of the square-wave signal generated by the limiting amplifier will thus show a variation (jitter) relating to the noise in the input signal from the thermal RC network. This jitter adversely affects the constancy and accuracy of the frequency of the arrangement as a whole. An example of the effect of thermal noise on the function of an oscillator circuit from the prior art is illustrated by V. Székely et al., in "Test structure for thermal monitoring", Proc. 1996 IEEE Int. Conf. on Microelectronic Test Structures, Vol. 9, March 1996, pp. 111-115 (FIG. 8).

Due to the aforementioned reasons, the power dissipation of the oscillator circuit from the prior art is relatively high, while its accuracy will be relatively low.

SUMMARY OF THE INVENTION

It is an object of the present invention to provide an oscillator which is inherently more accurate than the oscillator from the prior art.

This object is achieved by an oscillator device for generating an oscillator signal, comprising at least a first heater, a temperature sensor, signal processing means, and a voltage controlled oscillator, an output of the temperature sensor being connected to an input of the signal processing means; an output of the signal processing means being connected to an input of the voltage controlled oscillator; an output of the voltage controlled oscillator in a first feedback-loop having a first connection to an input of the at least one first heater, the voltage controlled oscillator, in use, being capable of generating an oscillator signal, the oscillator signal being provided as heating drive signal to the at least one first heater over the first connection, and the signal processing means being capable of providing a signal for altering a frequency of the oscillator signal, characterised in that the signal processing means are arranged to implement the function of a synchronous demodulator.

Advantageously, the present invention provides the oscillator device with a feedback loop which ensures that the oscillator device operates substantially at a fixed frequency with, in comparison to the prior art, a strongly reduced jitter. The synchronous demodulator operates as follows: The signal produced by the thermal RC network and sensed by the temperature sensor is amplified in a substantially linear mode, different from the limiting amplifier in the circuit of the prior art. Next, the signal is correlated with the frequency of the voltage controlled oscillator. Finally, the signal is filtered in low pass mode to cancel out variations by thermal noise.

In addition to the higher accuracy of the generated frequency (less jitter) it is also possible to use a lower power input for the thermal RC network and allow a lower signal/noise ratio than for the oscillator circuit from the prior art.

Thus, the present invention provides an oscillator device with improved performance and which can be integrated on a semiconductor chip using elements available in a standard IC process.

In a second embodiment, the present invention relates to an oscillator device as described above, in which the oscillator device in a second feedback-loop further comprises a polarity reversing device for providing an oscillation of the polarity of the heater drive signal for either the first heater or the first and second heaters.

In a third embodiment, the present invention relates to an oscillator device as described above, in which the oscillator device in a third feedback-loop further comprises a polarity reversing device for providing an oscillation of the polarity of the heating power generated by the first heater or the first and second heaters.

Moreover, the present invention relates to a semiconductor device comprising an oscillator device as described above. Also, the present invention relates to a temperature sensor comprising an oscillator device as described above.

The present invention allows a full integration of the oscillator device on any type of semiconductor using any suitable integrated circuit fabrication technology.

BRIEF DESCRIPTION OF THE DRAWINGS

The invention will be explained in more detail below with reference to a few drawings in which illustrative embodiments thereof are shown. They are intended exclusively for illustrative purposes and not to restrict the inventive concept, which is defined by the claims.

DETAILED DESCRIPTION OF THE PRESENT INVENTION

For the purpose of the teaching of the invention, preferred embodiments of the method and devices of the invention are described below. It will be appreciated by the person skilled in the art that other alternative and equivalent embodiments of the invention can be conceived and reduced to practice without departing from the concept of the invention, the scope of the invention being limited only by the appended claims.

Figure 1:
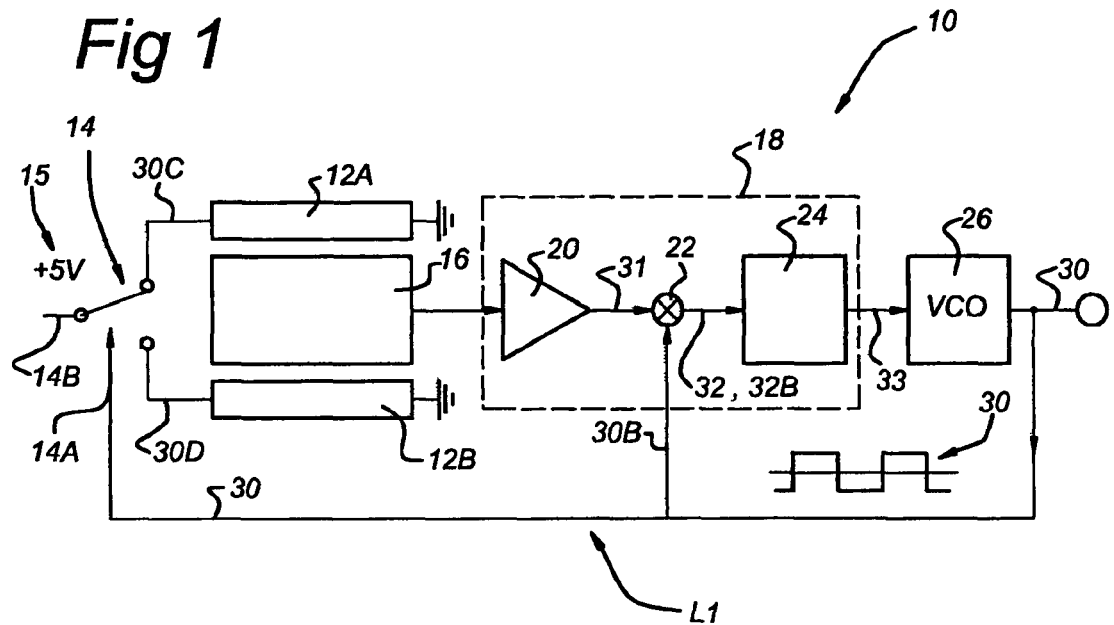
FIG. 1 shows schematically a first embodiment of the oscillator device in accordance with the present invention.

FIG. 1 shows schematically a block diagram of a first embodiment of the oscillator device in accordance with the present invention.

The oscillator device 10 comprises a thermopile 16, a heater arrangement 12A, 12B, a first switching element 14, signal processing means 18 and a voltage controlled oscillator 26.

The thermopile 16 and heater arrangement 12A, 12B form a thermal RC network Instead of the thermopile 16 any type of suitable temperature sensor may be used. For example, an array of transistors may also be employed for detecting the thermal signal generated by the heater arrangement 12A, 12B.

The heater arrangement 12A, 12B comprises two resistive heater elements 12A,

The signal processing means 18 as shown in FIG. 1 are arranged to have a function of a synchronous demodulator.

In the embodiment shown in FIG. 1, the signal processing means 18 comprise a linear amplifier 20, a chopper 22, and a low pass filter element 24.

The thermal RC network has an output connected to an input of the linear amplifier 20. An output of the linear amplifier 20 is connected to a first input of the chopper 22. An output of the chopper 22 is connected to an input of the low pass filter element 24. An output of the low pass filter element 24 is connected to an input of the voltage-controlled-oscillator 26. At an output of the voltage controlled oscillator 26 an periodic or oscillator signal 30 with a frequency F1, proportional to the input voltage of the voltage controlled oscillator 26, is available during use of the circuit 10. The voltage controlled oscillator 26 is capable of generating the periodic or oscillator signal 30, and of altering a frequency F1 of the oscillator signal in response to a signal provided on the output of the low pass filter element 24 to the input of the voltage controlled oscillator.

As shown in FIG. 1, the periodic signal 30 typically is a square-wave, but other types of signals such as a sine wave may be used as well.

In a first feedback-loop L1 for the periodic signal 30, which loop extends from the output of the voltage controlled oscillator 26 to the selection input 14A of the first switching element 14 and to the second input of the chopper 22, the output of the voltage controlled oscillator 26 is connected to a second input of the chopper 22, and also to a selection input 14A of the first switching element 14. The first switching element 14 is arranged for providing during operation to one of the heater elements 12A, 12B, a first power signal and to the other of the heater elements 12A, 12B a second power signal as will explained in more detail below. One terminal of each resistive heater element 12A and 12B is connected to ground.

In the oscillator device 10 according to the present invention, the chopper 22 and low pass filter element 24 are arranged as a synchronous demodulator.

During use, the periodic signal 30 from the voltage controlled oscillator 26 is being provided to the selection input 14A as a switching signal. On a second input 14B of the first switching element 14 a power signal 15 (for example a +5V DC signal) is provided to power one of the heaters 12A, 12B when the switching element is in the switching state that connects the respective one of the heaters to the power signal 15, in a first state (for example, the oscillator signal 30 being at positive or high value) to the first heater 12A, and in a second state (in this example, the periodic signal 30 being at negative or low value) to the second heater 12B. Based on a value of periodic signal 30, which oscillates between the first and second states and is supplied on the selection input 14A, the switching state is controlled and in this manner the first switching element 14 alternatively powers one of the heater elements 12A, 12B with a first heater drive signal during for example the positive or high phase of the periodic signal, and the other of the heater elements 12A, 12B with a second heater drive signal during the negative or low phase of the periodic signal 30. Thus, the switching element 14 generates an oscillating heat flow between the heaters 12A, 12B. The thermopile 16 then senses a temperature oscillation which relates to the oscillating heat flow. A temperature-related signal is input from the thermopile 16 to the linear amplifier 20. The linear amplifier 20 amplifies the temperature-related signal and forwards an amplified signal 31 to (the first input of) the chopper 22.

Next to the amplified signal 31 received on the first input, the chopper 22 receives on the second input the (square-wave) periodic signal 30 from the voltage controlled oscillator 26 as a chopper control signal 30B. The amplified signal 31 and the periodic signal 30 (which as chopper control signal 30B is interpreted by the chopper as having values +1 and −1) are multiplied to form a chopper signal 32. Below, the chopper signal 32 will be described with reference to FIG. 2.

The chopper signal 32 is fed to the input of the low pass filter element 24, which filters the chopper signal in low-pass mode and forms an filtered signal 33. The filtered signal 33 is fed to the input of the voltage controlled oscillator 30, which adjusts the output frequency of the periodic signal 30 as a function of the filtered signal 33.

It is noted that the low-pass filter element 24 may also be embodied as an integration element, which averages the chopper signal over a predetermined time.

Furthermore, it is noted that the oscillator device 10 may comprise a single heater, in which case the first switching element 14 is omitted Under these circumstances, the synchronous demodulator 18 has, as described above, the same characteristics for signals from the thermopile 16 when heat pulses sensed by the thermopile 16 are generated by a single beater.

The present invention provides a feedback loop which ensures that the oscillator device 10 operates substantially at a feed frequency with, in comparison to the prior art, a strongly reduced jitter.

In addition to the higher accuracy of the generated frequency (less jitter) it is also possible to use a lower power input for the thermal RC network and allow a lower signal/noise ratio than for the oscillator circuit from the prior art.

For this reason, the oscillator device 10 may be suitable for applications which require relatively high accuracy (and preferably low power), for example, telecommunication and biomedical applications.

Figure 2:
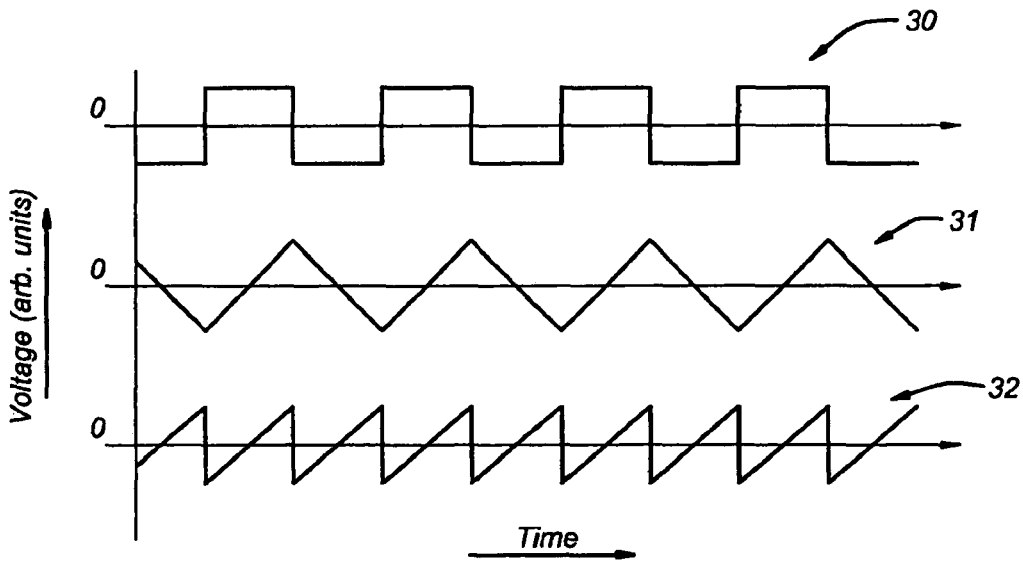
FIG. 2 shows schematically a timing diagram for the oscillator device in the first embodiment.

FIG. 2 shows schematically a timing diagram for the oscillator device in the first embodiment.

Objects indicated by the same reference numerals relate to identical objects as shown in the preceding figures.

As a function of time the course of the periodic signal 30, the amplified signal 31 (originating from the thermal RC network 16) and the chopper signal 32 are shown.

As described above with reference to FIG. 1, the chopper signal 32 is the signal resulting from the multiplication of the periodic signal 30 and the amplified signal 31. The amplified signal 31 will display some time-delay due to the finite diffusion rate of heat in the semiconductor substrate, but at some frequency the output (i.e. the chopper signal 32) will have a zero value. This is then the steady-state frequency of the oscillator output 30.

The chopper signal 32 in this exemplary case corresponds to a substantially saw-tooth shaped signal, which has a frequency substantially equal to the frequency F1 of the voltage controlled oscillator originated periodic signal 30.

Experiments have shown that, advantageously, the oscillator device 10 of the present invention can provide a gain of the signal/noise ratio by about two-orders of magnitude, in comparison with the signal/noise ratio of the oscillator circuit from the prior art.

Figure 3:
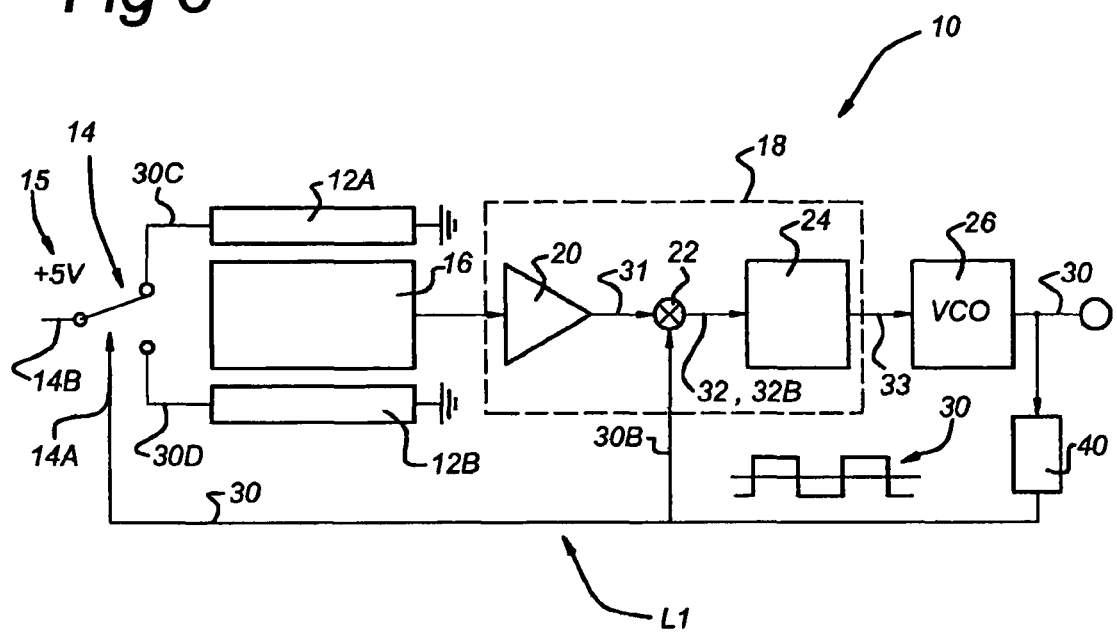
FIG. 3 shows a further embodiment of the oscillator device.

FIG. 3 shows a further embodiment of the oscillator device in accordance with the present invention. In FIG. 3 entities with the same reference number refer to identical entities as shown in the preceding figures. Optionally, the first feedback-loop L1 of the voltage controlled oscillator generated periodic signal 30 to the second input of the chopper 22 and to the heater arrangement comprises an output frequency divider 40 for reduction of the frequency F1 to a reduced value FR. The output frequency divider 40 is shown as a block with a dashed outline in FIG. 1. In this case a voltage controlled oscillator 26 with an output frequency F1 which is higher than would be achievable by the heat transfer rate in the thermal RC network can be used. The frequency F1 can be output to any external circuit (not shown), while for feedback the reduced frequency FR is used as input to heater arrangement and as input signal to the second input of the chopper 22, in order to maintain the oscillation operation of the oscillator device 10.

Typically, the oscillator device 10 of the present invention can be fully integrated on a chip. Persons skilled in the art will appreciate that the device can be implemented in any standard IC technology such as CMOS, Bipolar, III-V (electro-optic) or II-VI technology or a mixed technology such as BiCMOS. A semiconductor substrate on which the oscillator device is constructed may consist of silicon, germanium, gallium arsenide or any other suitable semiconductor material.

For example, using CMOS technology an oscillator device 10 can be manufactured using 0.7 μm lithographic technology. The heater elements 12A, 12B consist of resistors made from p+ doped resistor areas, and the thermopile 16 consists of p+ resistors and aluminium interconnect. A distance between the heater elements may for example be 100 μm The lateral spacing between a heater and the thermopile junctions is about 10 μm Note that depending on design and/or processing technology, the thermopile of thermal RC network may consist of one or more alternative suitable materials. Also, higher (or lower) resolution lithography (e.g., 0.25 μm or 0.18 μm) may be applied if desired.

Measurements as a function of a substrate base temperature over the range −40° C. to 80° C. were on the oscillator device 10 built around 5 samples of the thermal RC network 16. About 25 mW was dissipated in the heaters 12A, 12B. At room temperature, the frequency generated by the oscillator device 10 in this case is about 250 kHz, and may well be used as a frequency reference. The temperature sensitivity of the frequency of the oscillator device 10 is about −0.45%/° C.

This temperature sensitivity of the generated frequency is substantially related to the temperature-dependency of the thermal diffusivity of the substrate material in which the heat pulses are generated. Based on this temperature sensitivity, it is thus possible to use the oscillator device (10) of the present invention as a temperature sensor for sensing the temperature of the substrate.

Also, the present invention allows to apply a temperature compensation in the oscillator device in various ways:

First, temperature compensation may be achieved by creating a temperature-dependent phase shift between the periodic signal 30 and the chopper control signal 30B on the second input of the chopper. This would cause a temperature-dependent change in the frequency at which the output signal of the demodulator is zero.

Second, when using the embodiment shown in FIG. 3, the reduction factor N as used by the output frequency divider 40 to reduce F1 to FR (F1=N*FR) may be made temperature-dependent. In this manner, the frequency F1 can be adjusted so as to compensate for the temperature-dependency of the diffusion rate of heat in the semiconductor substrate.

Note that both compensation methods can be implemented by on-chip (digital) logic. Advantageously, both compensation methods can be combined.

Also, a lower heater power may be used by varying the amplitude of the periodic signal 30 between about 2 and about 5V, with the heater power then varying between about 4-25 mW.

It is noted that the thermal signal 31 generated by the heater arrangement 12A, 12B, 14 may be adversely affected by a presence of electrical cross-talk. Electrical cross-talk may be present due to the generation of an electrical field across the thermal RC network 16 by the signals applied to the two heaters 12A, 12B, and a capacitive coupling between each heater element 12A, 12B and the thermopile 16.

For instance, a sudden change in polarity of a signal provided to the heater 12A, 12B will result in the generation of a spike on the signal generated by the thermopile 16.

In that case, the thermal RC network 16 registers a distorted signal which comprises the thermal signal (relating to the heat pulses, as described above) and a further component generated by electrical cross-talk.

The presence and influence of the electrical cross-talk may depend on the actual voltage used on the heaters 12A, 12B, and also on physical and/or electronic properties of the semiconductor substrate on which the oscillator device 10 is constructed.

In the prior art, such adverse effects were usually mitigated by using heat pulses of sufficiently large amplitude (thus obtaining correspondingly large temperature variations), but such a measure is not desirable here, since the oscillator device 10 of the present invention is most capable of low power thermal operation.

Figure 4:
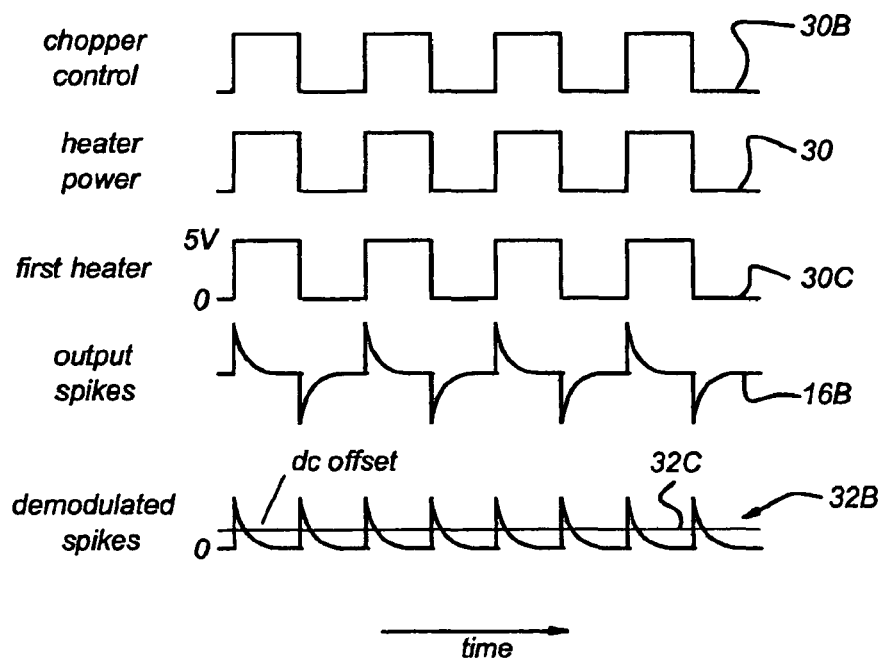
FIG. 4 shows schematically a further timing diagram.

To explain the influence of electrical cross-talk in more detail FIG. 4 shows a timing diagram for the first embodiment of the oscillator device 10.

The chopper control signal 30B as provided to the chopper 22 shows a shape of a square-wave.

The periodic signal 30 is provided to the first switching element 14 for controlling the switching state of the switching element 14.

The heater drive signal 30C provided to for example the first heater 12A is in sync with, and has a similar shape as, the chopper signal 30B and the periodic signal 30. Note that the heater drive signal 30D (not shown) as provided to the other heater element 12B is in anti-phase with the heater drive signal 30C.

Next, an output spike signal 16B as generated in the thermopile 16 is shown. Note that for simplicity the thermal signal resulting from the heat flow has been dropped from the output spike signal 16B as shown. The spike behavior is typically correlated to the heater drive signal as follows: the voltage spike is directed in the same direction as the change of the heater drive signal 30C.

The output spike signal 16B is amplified together with the thermal signal from the thermopile 16 in the linear amplifier 20 to the amplified signal 31, which is then demodulated by chopper 22 into the chopper signal 32 plus a demodulated spike signal 32B.

The demodulation of the output spike signal 16B results in the demodulated spike signal 32B (for reason of clarity, the thermal component of the chopper signal 32 has been dropped), which after low-pass filtering (in low-pass filter element 24) comprises a DC offset voltage 32C.

Similarly, for the other heater element 12B which is driven in anti-phase, similar DC offset voltage but with opposite sign will be generated.

To a first order, the spikes from one heater 12A and from the other heater 12B as sensed by the thermopile 16 will be cancelled out due to the anti-phase of the heater drive signals as applied to each of the heater 12A, 12B. As the voltage on one heater rises, the voltage on the other heater falls.

Advantageously, the arrangement as shown in FIG. 1 with two heater elements 12A, 12B improves the oscillator devices from the prior art, since the prior art discloses use of a single heater in the thermal RC network.

Due to the presence of these spikes, as will be apparent to the person skilled in the art, after demodulation in chopper 22, a residual DC offset component in the chopper signal 32 will result from the electrical cross-talk. This DC offset will be integrated by the integrator and lead to an error in the steady-state frequency at the VCO output.

Figure 5:
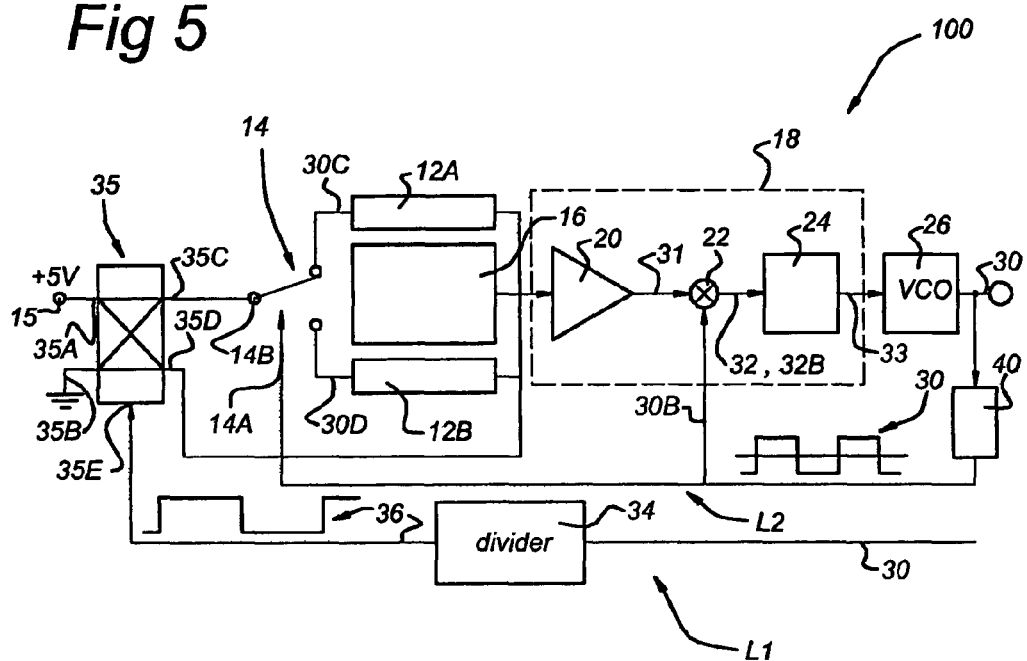
FIG. 5 shows schematically a second embodiment of the oscillator device in accordance with the present invention.

FIG. 5 shows schematically a second embodiment of the oscillator device in accordance with the present invention. In FIG. 5 entities with a same reference number refer to identical entities as shown in the preceding figures.

The second embodiment of the oscillator device 100, which comprises the circuit of the oscillator device 10 in the first embodiment, further comprises a polarity reversing device in a second feedback-loop L2 which extends between the output of the voltage controlled oscillator (26) and the (inputs of the) first switching element 14. The polarity reversing device comprises a second switching element 35 and a frequency dividing element 34. In the second embodiment, first and second heaters 12A, 12B each have one terminal connected to a common connection 12C. The function of the polarity reversing device 34, 35 is to provide heater drive signals on each of the heater elements 12A, 12B in such a way, that electrical cross-talk generated in the thermopile 16 by each heater can be compensated for. This function will be explained below in more detail.

Second switching element 35 has a first input 35A for a power signal 15, a second input 35B for a ground signal, a first output 35C connected to the second input 14B of the switching element 14 and a second output 35D connected to the common connection 12C of the first and second heaters 12A, 12B.

Furthermore, the second switching element 35 comprises a selection input 35E for controlling the state of the first and second outputs 35C, 35D.

In parallel to its connections (in the first feedback-loop L1) to the first input 14A of the switching element 14 and the second input of the chopper 22, the output of the voltage controlled oscillator 26 is also connected (within the second feedback-loop L2) to an input of a frequency dividing element 34. An output of the frequency dividing element 34 is connected to the selection input 35E of the second switching element 35.

The frequency dividing element 34 is arranged for receiving the periodic signal 30 on its input, dividing its frequency F1 by some integer number, for example, by 2, and outputting a divided frequency signal 36 with a time-averaged value of zero and a frequency F2 on its output. Other square-wave signals (e.g. a pseudo-random signal) that satisfy the criterion of having a time-average of zero, may be used instead of the divided frequency signal 36.

The selection input 35E of the second switching element 35 is arranged for receiving the divided frequency signal 36.

In use, the second switching element 35 provides an oscillation of the polarity (or flow of current) of the heater drive signals 30C, 30D to the heaters 12A, 12B.

Based on the periodic signal 30 as provided on first input 14A of the switching element a signal from the second switching element 35 is provided through the second input 14B of the switching element 14 either to first heater 12A or to the second heater 12B The switching of the signal from the second switching element 35 from one of the heaters 12A, 12B to the other therefore fluctuates with the frequency F1 of the periodic signal 30.

The signal provided on the second input 14B of the switching element 14 is either the power signal 15 or the ground signal depending on the frequency divided signal 36 as provided on the selection input 35E of the second switching element 35. Based on divided frequency signal 36 the second switching element 35 is capable of providing the power signal 15 on one of the first and second outputs 35C, 35D and the ground signal on the other of the first and second outputs 35C, 35D.

Thus, by the combination of the periodic signal 30 on the first input 14A of the switching element 14 and the divided frequency signal 36 on the selection input 35E, the oscillator device of the present invention is capable of providing a sequence of heating power signals to the heaters 12A, 12B in such a way that the influence of spikes generated by electrical cross-talk on the thermopile signal is cancelled out.

This will explained in more detail with reference to FIG. 6.

Figure 6:
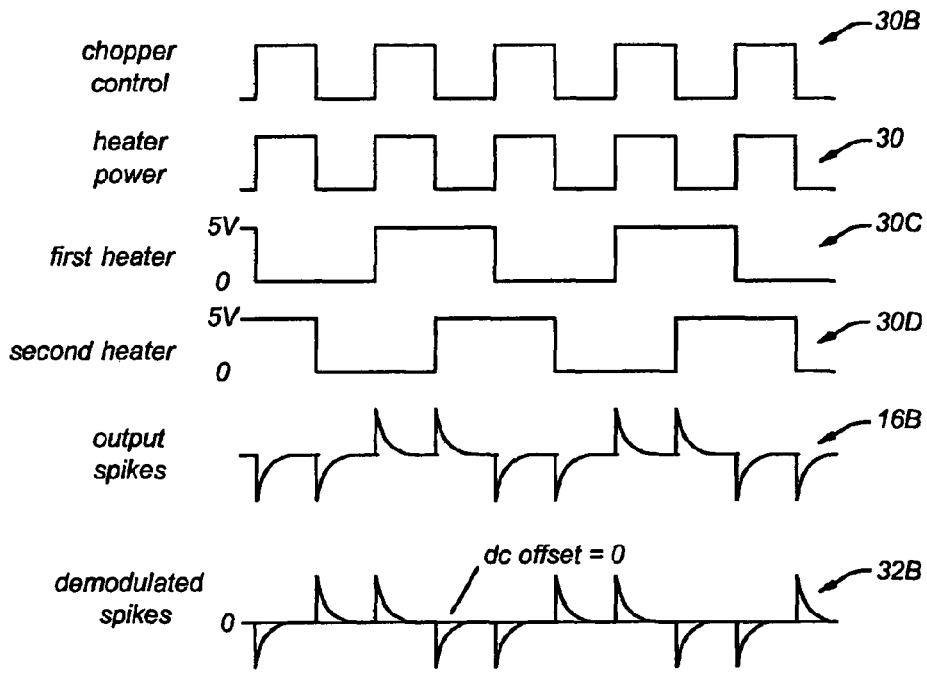
FIG. 6 shows schematically a still further timing diagram for illustrating the function of the oscillator device.

FIG. 6 shows a timing diagram for the second embodiment of the oscillator device 10. In FIG. 6 entities with the same reference number refer to identical entities as shown in the preceding figures.

In the non-limiting example shown here, the frequency F2 as generated by the frequency dividing element 34 is half of the frequency F1 of the periodic signal 30.

The chopper control signal 30B as provided to the chopper 22 is a square-wave.

The periodic signal 30 having frequency F1 is provided to the first input 14A of the switching element 14 for controlling the switching state of the switching element 14.

The heater drive signal 30C provided to one terminal of the first heater 12A displays a frequency F2 (or half of F1).

The heater drive signal 30D as provided to the other terminal displays a square-wave signal with a frequency F2.

The heater drive signals provided on the terminals of the first heater and second heater element 12A, 12B are such as to ensure that the frequency of the sequence of heat pulses still equals the oscillator frequency F1. It can be verified from the timing diagram of FIG. 6 that the resultant frequency of the sequence of heat pulses sensed by the thermopile 16 still equals the oscillator frequency F1 of the periodic signal 30.

Next, an output spike signal 16B in the thermopile 16 will be generated as shown. In this spike signal 16B the sequence of upward and downward spikes is no longer alternating as shown in FIG. 4, but shows a sequence which is a superposition of upward and downward spikes generated by the pulse sequence for the first heater terminal and generated by the different pulse sequence on the second heater terminal 12B.

Note that for clarity the thermal signal resulting from the heat flow has been dropped from the output spike signal 16B as shown.

The output spike signal 16B is amplified together with the thermal signal from the thermopile 16 in the linear amplifier 20 to the amplified signal 31, which is then demodulated by chopper 22 into the chopper signal 32 plus a demodulated spike signal 32B.

In the first embodiment 10, the demodulation of the output spike signal 16B results in the demodulated spike signal 32B (for reason of clarity, the thermal component of the chopper signal 32 has been dropped), which after low-pass filtering (in low-pass filter element 24) comprises a DC offset voltage 32C.

In the second embodiment 100, the demodulation step in the chopper 22 results in a sequence of demodulated spikes which are either upward or downward, different from the sequence shown in FIG. 4. By low-pass filtering in the low-pass filter element 24, the net DC offset voltage 32C is substantially equal to zero.

It is noted that this cancellation of electrical cross-talk is effective irrespective of any asymmetry of the arrangement of the heaters 12A, 12B around or near the thermopile 16.

Also, it is noted that the polarity reversing device 34, 35 may be embodied by analogue elements or by one or more logical circuits.

It is noted also that the polarity reversing device 34, 35 may be combined with the embodiment shown in FIG. 3. In that case the output frequency divider 40 is arranged in a common part of both the first feedback-loop L1 and the second feedback-loop L2. During use, the output signal 30 with reduced frequency FR as generated by the output frequency divider 40 is provided on both the first feedback-loop L1 and the second feedback-loop L2. In FIG. 5 the location of the output frequency divider 40 is indicated by a dashed outline.

Moreover, it will be appreciated by the skilled person that the polarity reversing device 34, 35 may also be used in an oscillator device with a single heater element, in which case the polarity over the heater element can be directed in a first direction and similarly as discussed above can be reversed.

Figure 7:
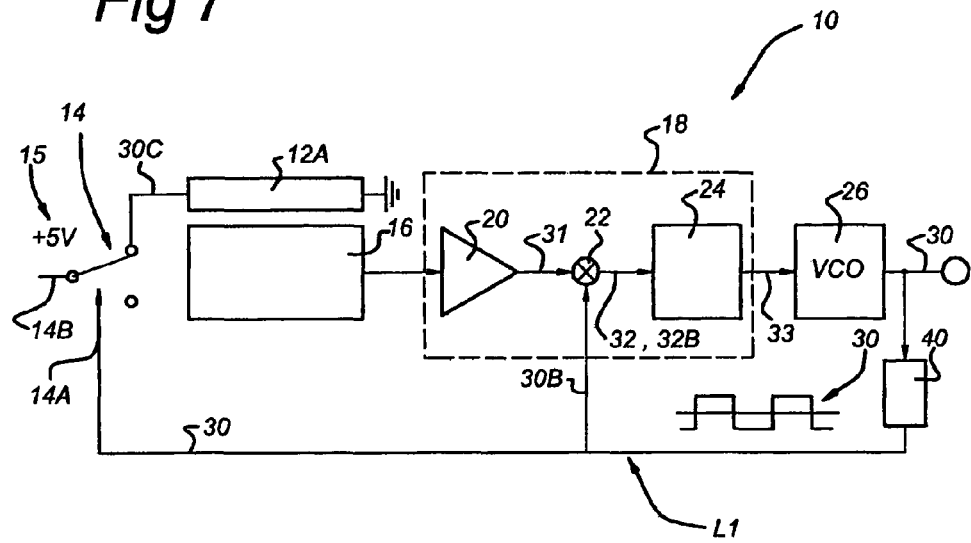
FIG. 7 shows a still further embodiment of the oscillator device.

FIG. 7 shows a still further embodiment of the oscillator device comprising a single heater element.

In FIG. 7 entities with the same reference number refer to identical entities as shown in the preceding figures. FIG. 7 shows an oscillator device 110 with a circuit similar to that shown in FIG. 1. Instead of two heaters 12A, 12B only a single heater 12A is arranged in the vicinity of the temperature sensor, thermopile 16.

Figure 8:
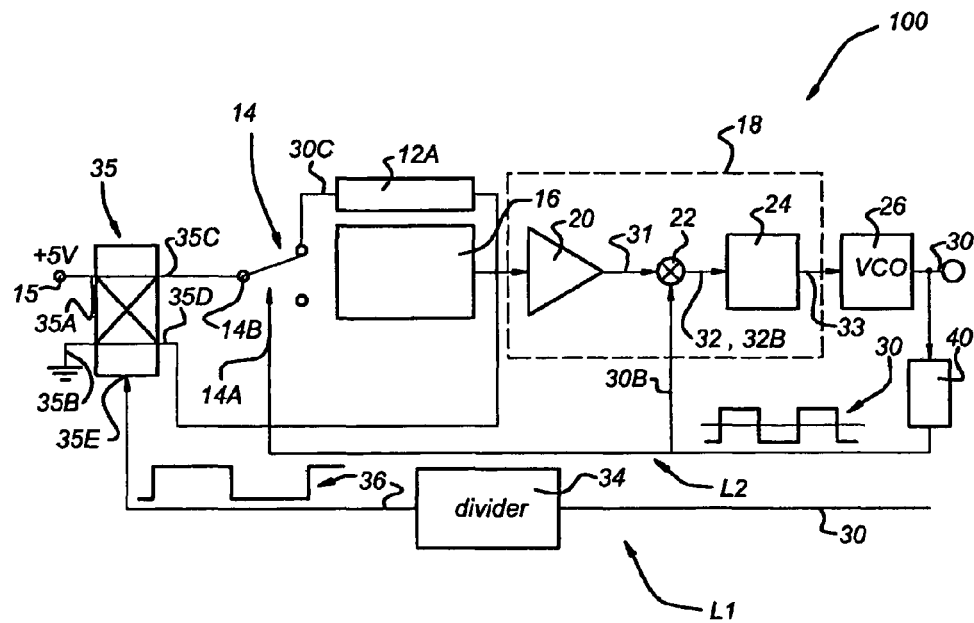
FIG. 8 shows yet another embodiment of the oscillator device.

FIG. 8 shows a yet another embodiment of the oscillator device comprising a single heater element.

In FIG. 8 entities with the same reference number refer to identical entities as shown in the preceding figures. FIG. 8 shows an oscillator device 120 with a circuit similar to that shown in FIG. 4. Instead of two heaters 12A, 12B only a single heater 12A is arranged in the vicinity of the temperature sensor, thermopile 16.

In relation to FIG. 7 and FIG. 8 it is noted that in case a single heater element 12A is used in the oscillator device, a second thermopile may be positioned along the heater element 12A in such a way that the heater 12A is in between the thermopile 16 and the second thermopile. By summing the signals sensed on the thermopile 16 and the second thermopile, the level of the heater drive signal 30C can advantageously be reduced by a factor of two, to obtain an input signal to the linear amplifier 20 at substantially the same level as in case of a single thermopile 16 as shown in FIGS. 7 and 8.

It can be envisioned that the duty cycle of the oscillator output signal 30 of the voltage controlled oscillator 26 may not be exactly 50%. In that case, in the embodiments illustrated above the oscillator signal at output 30 may show an offset which affects the precision of the periodic signal 30.

Figure 9:
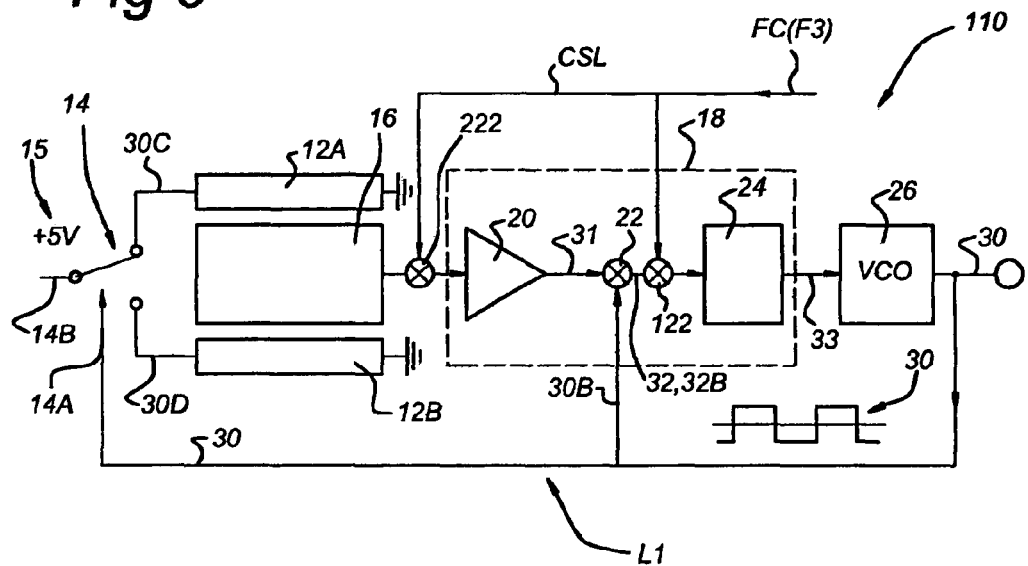
FIG. 9 shows another embodiment of the oscillator device.

FIG. 9 shows an other embodiment 110 of the oscillator device which provides for a correction of a possible offset of the voltage controlled oscillator 26. In FIG. 9 entities with the same reference number refer to identical or similar entities as shown in the preceding figures. The embodiment 110 of FIG. 9 differs from the embodiment 10 shown in FIG. 1 in that the oscillator device 110 comprises a second chopper 122 and a third chopper 222.

The second chopper 122 is arranged in the connection between the first chopper 22 and the low pass filter element 24. An input of the second chopper 122 is connected to the output of the first chopper 22 and an output of the second chopper 122 is connected to the input of the low pass filter element 24. A second input of the second chopper 122 is connected to a chopper signal line CSL for, during use, receiving a chopper frequency signal FC.

The third chopper 222 is arranged in between the thermopile 16 and the linear amplifier 20. An input of the third chopper 222 is connected to the output of the thermopile (temperature sensor) 16 and an output of the third chopper 222 is connected to the input of the linear amplifier 20. A second input of the third chopper 222 is connected to the chopper signal line CSL for, during use, receiving the chopper frequency signal FC.

The oscillator device 110 is capable of canceling an offset at the multiplier output 30 of the voltage controlled oscillator 26 by periodically alternating the phase of the heater drive signals, which is effectuated by the actions of the second and third choppers 122, 222. Both second and third choppers 122, 222 are driven by the chopper frequency signal FC which typically may be a square-wave signal with a frequency F3.

The frequency F3 of the chopper frequency signal FC may be chosen as a smaller frequency than the frequency F1 of the oscillator output signal 30 of the voltage controlled oscillator 26 (F3<<F1, when using a digital divider element (not shown) to derive F3 from the F frequency signal, F3 may, for example, be equal to F1/128).

Since the signals at the input of the linear amplifier 20 are very small, it is required that the third chopper 222 is designed very carefully so as not to distort these input signals.

Figure 10:
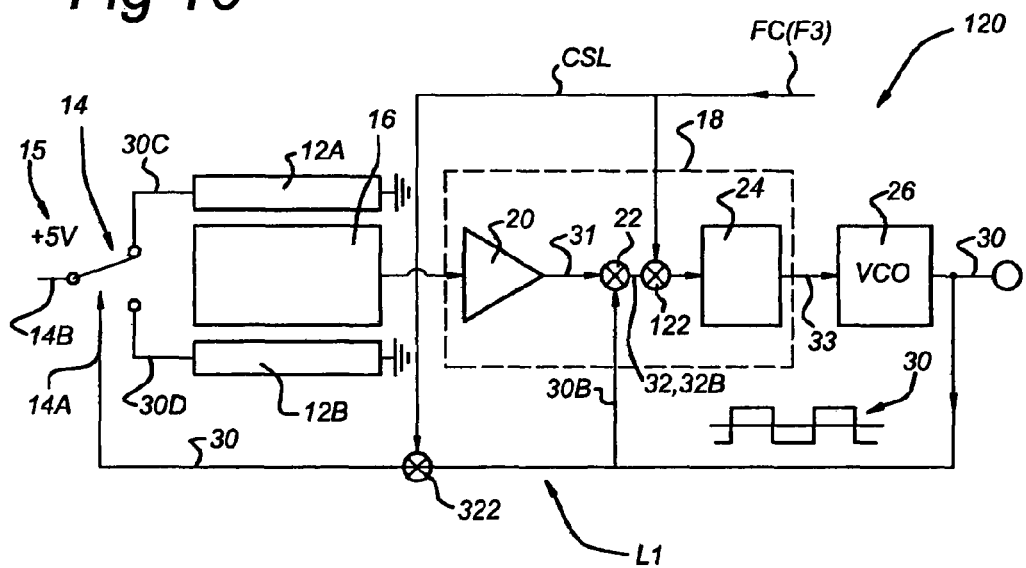
FIG. 10 shows another further embodiment of the oscillator device according to the present invention.

FIG. 10 shows an alternative embodiment 120 of the oscillator device according to the present invention. In FIG. 10 entities with the same reference number refer to identical or similar entities as shown in the preceding figures. Again, the embodiment 120 of FIG. 10 provides for a correction of possible offset due to deficiencies of the voltage controlled oscillator 26 while in comparison to the embodiment of FIG. 9 the design requirements in relation to the third chopper are significantly reduced.

The embodiment 120 of FIG. 10 differs from the embodiment 10 shown in FIG. 1 in that the oscillator device 110 comprises a second chopper 122 and a further chopper 322.

The second chopper 122 is arranged in the connection between the first chopper 22 and the low pass filter element 24. An input of the second chopper 122 is connected to the output of the first chopper 22 and an output of the second chopper 122 is connected to the input of the low pass filter element 24. A second input of the second chopper 122 is connected to a chopper signal line CSL for, during use, receiving a chopper frequency signal FC.

The further chopper 322 is arranged in the first feedback loop L1 at (or near to) the input of the first switching element 14. An input of the further chopper 322 is connected to the output of the voltage controlled oscillator 26 via feedback loop L1. An output of the further chopper 322 is connected to the input of the first switching element 14 (or more in general, the heater arrangement). A second input of the further chopper 322 is connected to the chopper signal line CSL for, during use, receiving the chopper frequency signal FC. The oscillator device 120 is capable of canceling an offset at the multiplier output 30 by periodically alternating the phase of the heater drive signals through the actions of the second and further choppers 122, 322. Both second and further choppers 122, 322 are driven by the chopper frequency signal FC which typically may be a square-wave signal with a frequency F3.

The frequency F3 of the chopper frequency signal FC may be chosen as a smaller frequency than the frequency F1 of the oscillator output signal 30 of the voltage controlled oscillator 26 (F3<<F1).

Since the signal in the first feedback loop L1 are relatively strong signals, the requirement on the design of the further chopper 322 is advantageously relaxed in comparison with the third chopper 222 in the embodiment of the oscillator device 110 as shown in FIG. 9.

The invention claimed is:
1. An oscillator device for generating an oscillator signal, comprising:
at least one first heater, a temperature sensor, signal processing means, and a voltage controlled oscillator;
the temperature sensor and the at least first heater forming a thermal RC network;
an output of the temperature sensor being connected to an input of the signal processing means;
an output of the signal processing means being connected to an input of the voltage controlled oscillator;
the oscillator device having a first feedback-loop comprising an output of the voltage controlled oscillator having a first connection to an input of the at least one first heater;
the voltage controlled oscillator configured to generate an oscillator signal, the oscillator signal being provided as a switching signal for a heating drive signal to the at least one first heater over the first connection, and the signal processing means configured to provide a signal for altering a frequency of the oscillator signal;
the first feedback loop configured to ensure that the oscillator device operates substantially at a fixed frequency related to an output signal from the thermal RC network, wherein the signal processing means are arranged to implement the function of a synchronous demodulator, the signal processing means comprising a linear amplifier, a chopper, and a low-pass filter element;
the linear amplifier having an input being connected to the output of the temperature sensor and having an output being connected to a first input of the chopper, the chopper having an output being connected to an input of the low-pass filter element and having in the first feedback-loop a second input being connected to an output of the voltage controlled oscillator, and
the low-pass filter element having an output being connected to the input of the voltage controlled oscillator,
the linear amplifier arranged for amplifying in a substantially linear mode a signal from the temperature sensor to a linearly amplified signal;
the chopper receiving on the first input the linearly amplified signal, and receiving on the second input, from the first feedback loop, the oscillator signal as a chopper control signal;
the chopper being arranged for multiplication of the amplified signal and the chopper control signal to form a chopper signal, the chopper control signal being interpreted as having values +1 and −1;
the chopper signal being fed to the low-pass filter element.
2. The oscillator device according to claim 1, wherein the oscillator device comprises a second heater element and a first switching element;
the first switching element being arranged in said first connection with a first output of the first switching element being connected to the at least one first heater, a second output of the first switching element being connected to the second heater, a selection input of the first switching element being connected to the output of the voltage controlled oscillator, and the first switching element being arranged with a power signal input for receiving a power input signal;
the first switching element being arranged for:
1) receiving the oscillator signal from the voltage controlled oscillator, and
2) providing the power input signal as a heater drive signal to either the at least one first heater element or the second heater element, based on a switching value of the oscillator signal as received on the selection input.
3. The oscillator device according to claim 1, wherein the oscillator device has a second feedback-loop, comprising a polarity reversing device for providing an oscillation of the polarity of the heater drive signal for either the at least one first heater or the at least one first heater and a second heater, and the polarity reversing device comprises a frequency dividing element and a second switching element;

the frequency dividing element having an input being in a second connection to the output of the voltage controlled oscillator and an output being connected to a selection input of the second switching element;

the second switching element having a first input for receiving a power input signal, a second input for a ground signal, a first output being connected to the second input of the first switching element and a second output being connected to the an other terminal of the at least one first heater;

the frequency dividing element providing a divided frequency signal to the selection input of the second switching element; the second switching element being arranged for providing the power input signal to one of the first and second outputs and the ground signal to the other of the first and second outputs based on a divided frequency signal.

4. The oscillator device according to claim 2, wherein the oscillator device has a second feedback-loop comprising a polarity reversing device for providing an oscillation of the polarity of the heater drive signal for either the at least one first heater or the at least one first heater and the second heater, the polarity reversing device comprising a frequency dividing element and a second switching element;

the frequency dividing element having an input in a second connection to the output of the voltage controlled oscillator and an output being connected to a selection input of the second switching element;

the second switching element having a first input for receiving the power input signal, a second input for a ground signal, a first output being connected to the second input of the first switching element and a second output being connected to a common connection of one terminal of the at least one first heater and one terminal of the second heater; the frequency dividing element providing a divided frequency signal to the selection input of the second switching element; the second switching element being arranged for providing the power input signal to one of the first and second outputs and the ground signal to the other of the first and second outputs based on the divided frequency signal.

5. The oscillator device according to claim 1, wherein the oscillator device comprises a second chopper;

the second chopper being arranged in the connection between the chopper and the low pass filter element, an input of the second chopper being connected to the output of the chopper, an output of the second chopper being connected to the input of the low pass filter element and a second input of the second chopper being connected to a chopper signal line for receiving a chopper frequency signal.

6. The oscillator device according to claim 5, wherein the oscillator device further comprises a third chopper;

the third chopper being arranged in the connection between the temperature sensor and the linear amplifier, an input of the third chopper being connected to the output of the temperature sensor, an output of the third chopper being connected to the input of the linear amplifier and a second input of the third chopper being connected to the chopper signal line for receiving the chopper frequency signal.

7. The oscillator device according to claim 6, wherein the oscillator device further comprises a fourth chopper;

the fourth chopper being arranged in the first feedback loop at the input of the at least one first heater, an input of the fourth chopper being connected to the output of the voltage controlled oscillator, an output of the fourth chopper being connected to the input of the at least one first heater and a second input of the fourth chopper being connected to the chopper signal line for receiving the chopper frequency signal.

8. The oscillator device according to claim 6, wherein the chopper frequency signal comprises a square wave signal, a frequency of the square wave signal being smaller than the frequency of the oscillator signal.

9. The oscillator device according to claim 7, wherein at least one of the second chopper and the third or fourth chopper are implemented by digital logic gates.

10. The oscillator device according to claim 1, wherein a digital divider element is arranged for dividing a frequency of the oscillator signal for providing a chopper frequency signal with a chopper frequency, the chopper frequency being smaller than the oscillator signal frequency.

11. The oscillator device according to claim 3, wherein the frequency dividing element is configured to divide a frequency of the oscillator signal by an integer denominator for providing a divided frequency signal with a second frequency.

12. The oscillator device according to claim 11, wherein temperature compensation means are provided for producing a change of the integer denominator of the frequency dividing element as a function of temperature.

13. The oscillator device according to claim 1, wherein temperature compensation means are provided for producing a temperature dependent phase shift between the oscillator signal and a chopper control signal on the second input of the chopper.

14. The oscillator device according to claim 1, wherein the oscillator device further comprises an output frequency divider for generating an oscillator signal with reduced frequency.

15. The oscillator device according to claim 1, wherein the temperature sensor comprises a thermopile, a thermistor, an array of transistors, or any combination thereof.

16. The oscillator device according to claim 1, wherein the low-pass filter element comprises a time-integration element.

17. A semiconductor device comprising an oscillator device according to claim 1.

18. The semiconductor device according to claim 17, wherein the semiconductor device is manufactured in at least one of CMOS, bipolar, III-V, II-VI and a mixed technology.

19. A temperature sensor comprising an oscillator device according to claim 1.

* * * * *